United States Patent
Ting et al.

(10) Patent No.: US 9,548,138 B2
(45) Date of Patent: Jan. 17, 2017

(54) TEST METHOD FOR MEMORY

(71) Applicant: MACRONIX INTERNATIONAL CO., LTD., Hsinchu (TW)

(72) Inventors: Ying-Tsai Ting, Hsinchu (TW); Che-Chin Wu, Hsinchu (TW); Tsung-Yi Chou, Jhubei (TW); Shih-Fu Huang, Zhongli (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 115 days.

(21) Appl. No.: 14/474,382

(22) Filed: Sep. 2, 2014

(65) Prior Publication Data

US 2016/0064103 A1    Mar. 3, 2016

(51) Int. Cl.
| | | |
|---|---|---|
| *G11C 29/00* | (2006.01) |
| *G11C 29/38* | (2006.01) |
| *G11C 29/42* | (2006.01) |
| *G11C 29/44* | (2006.01) |
| *G11C 17/00* | (2006.01) |
| *G11C 29/12* | (2006.01) |

(52) U.S. Cl.
CPC .............. *G11C 29/38* (2013.01); *G11C 29/42* (2013.01); *G11C 29/44* (2013.01); *G11C 29/702* (2013.01); *G11C 17/00* (2013.01); *G11C 2029/1204* (2013.01)

(58) Field of Classification Search
None
See application file for complete search history.

(56) References Cited

U.S. PATENT DOCUMENTS

| | | | | |
|---|---|---|---|---|
| 5,965,922 A * | 10/1999 | Matsui | ................. | G11C 11/412 |
| | | | | 257/369 |
| 7,130,222 B1 * | 10/2006 | Ho | ..................... | G11C 16/3468 |
| | | | | 365/185.18 |
| 2003/0231525 A1 * | 12/2003 | Mine | ....................... | G11C 7/14 |
| | | | | 365/189.07 |
| 2004/0223353 A1 * | 11/2004 | Kim | ...................... | G11C 15/04 |
| | | | | 365/49.15 |
| 2012/0057398 A1 * | 3/2012 | Ouchi | .................. | G11C 11/412 |
| | | | | 365/154 |
| 2014/0241057 A1 * | 8/2014 | Funatsuki | ........... | G11C 16/102 |
| | | | | 365/185.03 |
| 2015/0380078 A1 * | 12/2015 | Liaw | .................... | G11C 11/419 |
| | | | | 365/156 |

* cited by examiner

*Primary Examiner* — Daniel McMahon
(74) *Attorney, Agent, or Firm* — McClure, Qualey & Rodack, LLP

(57) ABSTRACT

A test method tests a memory device including a memory array having a plurality of symmetric memory cells, a plurality of word lines and a plurality of bit lines. In testing a first word line, a first bit line is charged to test a single bit of a first half of an adjacent first symmetric memory cell; and a second bit line is charged to test a single bit of a second half of an adjacent second symmetric memory cell. In testing a second word line, the first bit line is charged to test a single bit of the second half of an adjacent third symmetric memory cell; and the second bit line is charged to test a single bit of the first half of an adjacent fourth symmetric memory cell. In testing each of the word lines, each of the bit lines is charged once.

6 Claims, 6 Drawing Sheets

TEST METHOD FOR MEMORY

TECHNICAL FIELD

The disclosure relates in general to a test method for a memory, and more particularly to a method for testing a memory by half page read.

BACKGROUND

Flash memory plays an important role in an electronic device. For example, a memory card having the flash memory may be used to increase the storage capacity of a mobile device. After the memory chips are manufactured, the memory chips are tested. Therefore, how to fast test the memory is one of the targets.

SUMMARY

The disclosure is directed to a method for testing a memory which reduces test time by half page read. In half page read, a single half of each of the memory cells is read and tested.

According to one embodiment, a test method for testing a memory device including a memory array is provided. The memory array includes a plurality of symmetric memory cells, a plurality of word lines and a plurality of bit lines. In testing a first word line of the word lines, a first bit line of the bit lines is charged to test a single bit of a first half of a first symmetric memory cell adjacent to the first bit line; and a second bit line of the bit lines is charged to test a single bit of a second half of a second symmetric memory cell adjacent to the second bit line. In testing a second word line of the word lines, the first bit line of the bit lines is charged to test a single bit of the second half of a third symmetric memory cell adjacent to the first bit line; and the second bit line of the bit lines is charged to test a single bit of the first half of a fourth symmetric memory cell adjacent to the second bit line. In testing each of the word lines, each of the bit lines is charged once.

According to another embodiment, a test method for testing a memory device including a memory array is provided. The memory array includes a plurality of symmetric memory cells, a plurality of word lines and a plurality of bit lines. A half page read is performed on the memory array, wherein there are a first number of at least one defective lines of the memory array found during the half page read, and in the half page read, either one of a first half and a second half of each of the symmetric memory cells is read. The at least one defective line found during the half page read is repaired. A whole page read is performed on the repaired memory array and a defective status is recorded, wherein there are a second number of the at least one defective lines of the memory array found during the whole page read, and in the whole page read, both the first half and the second half of each of the symmetric memory cells are read. Whether the memory device passes test is determined based on the defective status and a relationship between the first and the second number.

Figure 1:
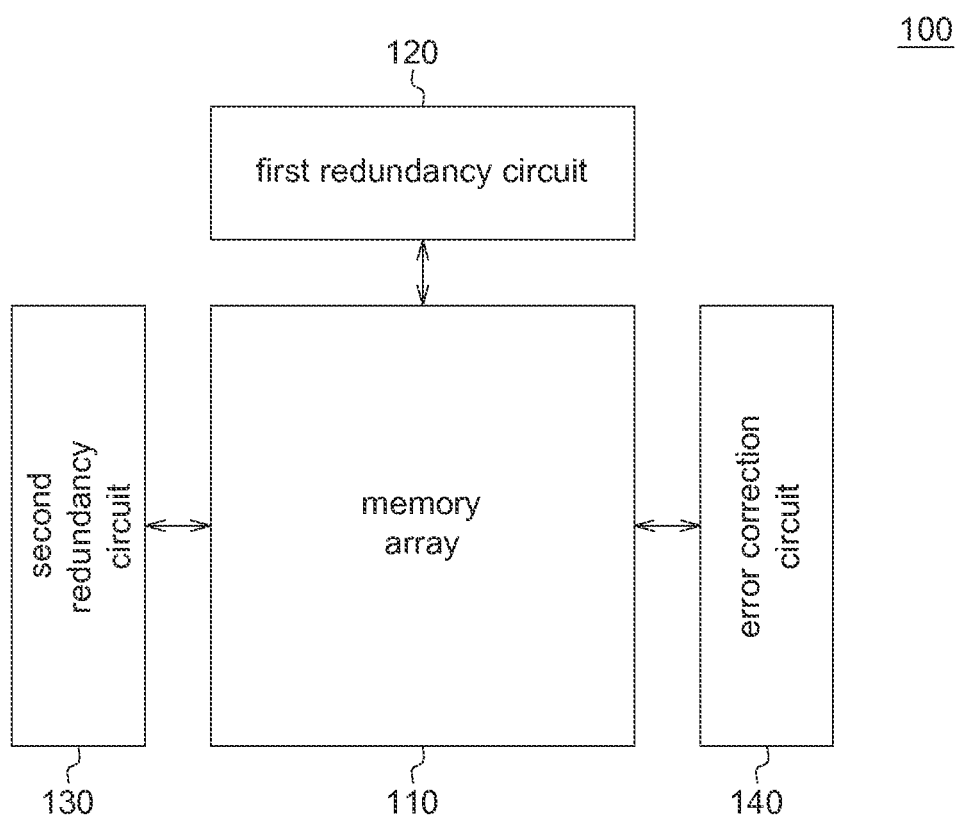
FIG. 1 shows a function block for a memory device.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Technical terms of the disclosure are based on general definition in the technical field of the disclosure. If the disclosure describes or explains one or some terms, definition of the terms is based on the description or explanation of the disclosure.

Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 shows a function block for a memory device. As shown in FIG. 1, the memory device 100 at least includes: a memory array 110, a first redundancy circuit 120, a second redundancy circuit 130 and an error correction circuit (ECC) 140.

The memory array 110 includes a plurality of memory cells, a plurality of word lines and a plurality of bit lines. The memory cells are arranged in an array. Each memory cell is a symmetric memory cell. The symmetric memory cell includes a left half and a right half; and each of the left half and the right half stores at least one bit. The bit number of the left half is the same as that of the right half.

In the memory array 110, the word lines are, for example, along x direction (i.e. horizontal direction) and the bit lines are, for example, along y direction (i.e. vertical direction).

The first redundancy circuit 120 is, for example, an x-direction redundancy circuit. After test, if the number of the defective memory cells on the word line reaches a first threshold, then the first redundancy circuit 120 may be used to replace (repair) the memory cells on the word line.

The second redundancy circuit 130 is, for example, a y-direction redundancy circuit. After test, if the number of the defective memory cells on the bit line reaches a second threshold, then the second redundancy circuit 130 may be used to replace (repair) the memory cells on the bit line.

After test, if the number of the defective memory cells on the word line or the bit line is smaller than the first/second threshold, then the ECC 140 may be used to replace (repair) the defective memory cells.

Figure 2:
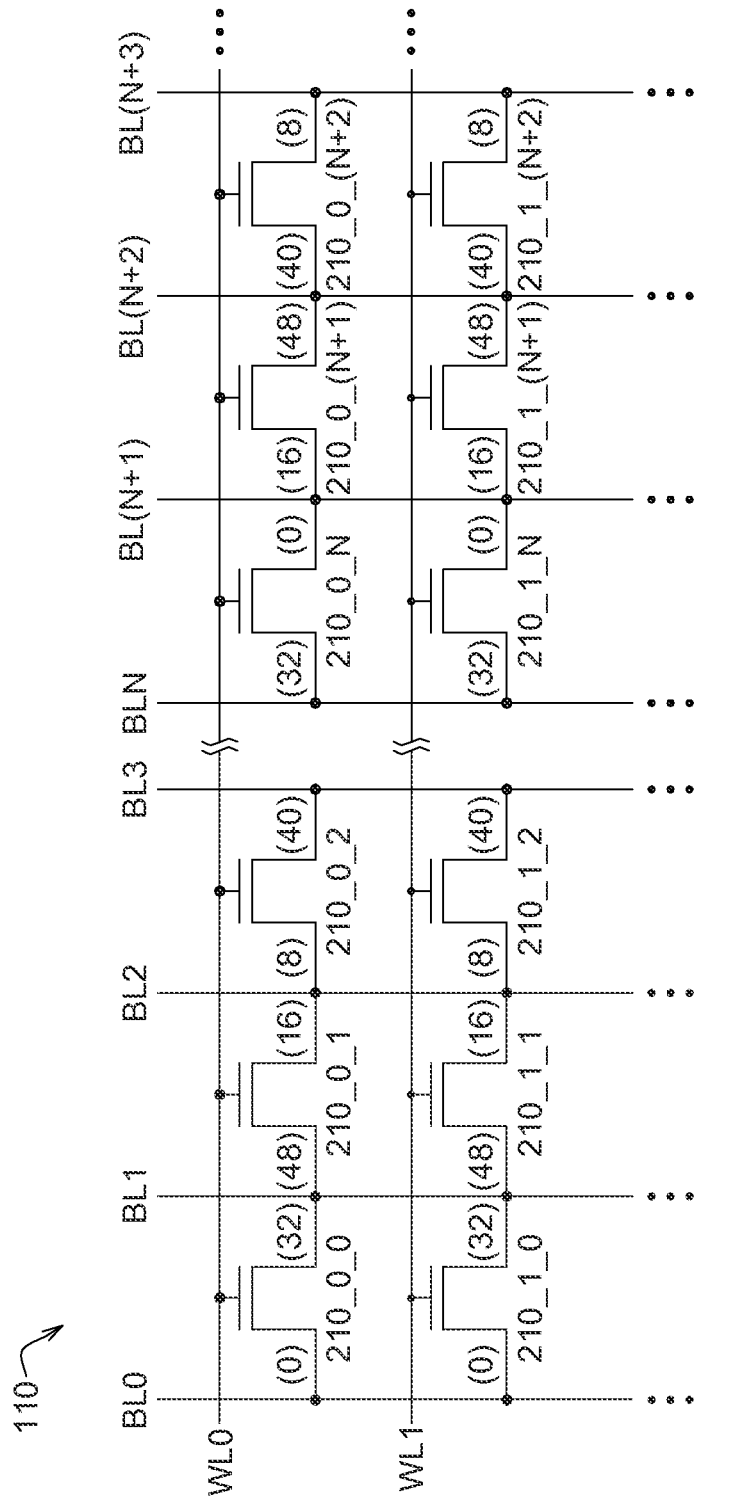
FIG. 2 shows a memory array.

FIG. 2 shows the memory array 110. As shown in FIG. 2, in the memory array 110, the word line WL0 is coupled to the memory cells 210_0_0, 210_0_1, 210_0_2, . . . , 210_0_N, 210_0_(N+1), 210_0_(N+2), . . . . N is a positive integer. Similarly, the word line WL1 is coupled to the memory cells 210_1_0, 210_1_1, 210_1_2 . . . 210_1_N, 210_1_(N+1), 210_1_(N+2) and so on. For simplicity, FIG. 2 shows two word lines WL0 and WL1 but the application is not limited by this.

The memory cell 210_0_0 includes a gate coupled to the word line WL0, a source and a drain. One of the source and the drain of the memory cell 210_0_0 is coupled to the bit line BL0, and the other of the source and the drain of the memory cell 210_0_0 is coupled to the bit line BL1. The coupling of other memory cells is similar.

The memory cells coupled to the same word line may be grouped in a plurality of pages. Furthermore, the left half bits and the right half bits of the same memory cell may be of different pages. As shown in FIG. 2, the left half bit of the memory cell 210_0_0 is of page 0 but the right half bit of the memory cell 210_0_0 is of page 32. In FIG. 2, the number shown in the half bit of the memory cell refers to the page number of the half bit of the memory cell.

How to perform memory test according to the embodiment of the application is described as follows. For simplicity, the word lines WL0, WL1 . . . are sequentially tested. The application is not limited thereby.

In the embodiment, in half page read, a single half (either one of the left half and the right half) of each memory cell is read. That is to say, not both the left half and the right half of the memory cell are read and tested. Further, in testing the same word line, each bit line is charged/sensed once. Further, in testing, the left half bits of about 50% of the memory cells on the same bit line are read and tested, and the right half bits of about the other 50% of the memory cells on the same bit line are read. Similarly, in testing, the left half bits of about 50% of the memory cells on the same word line are read, and the right half bits of about the other 50% of the memory cells on the same word line are read.

Figure 3A:
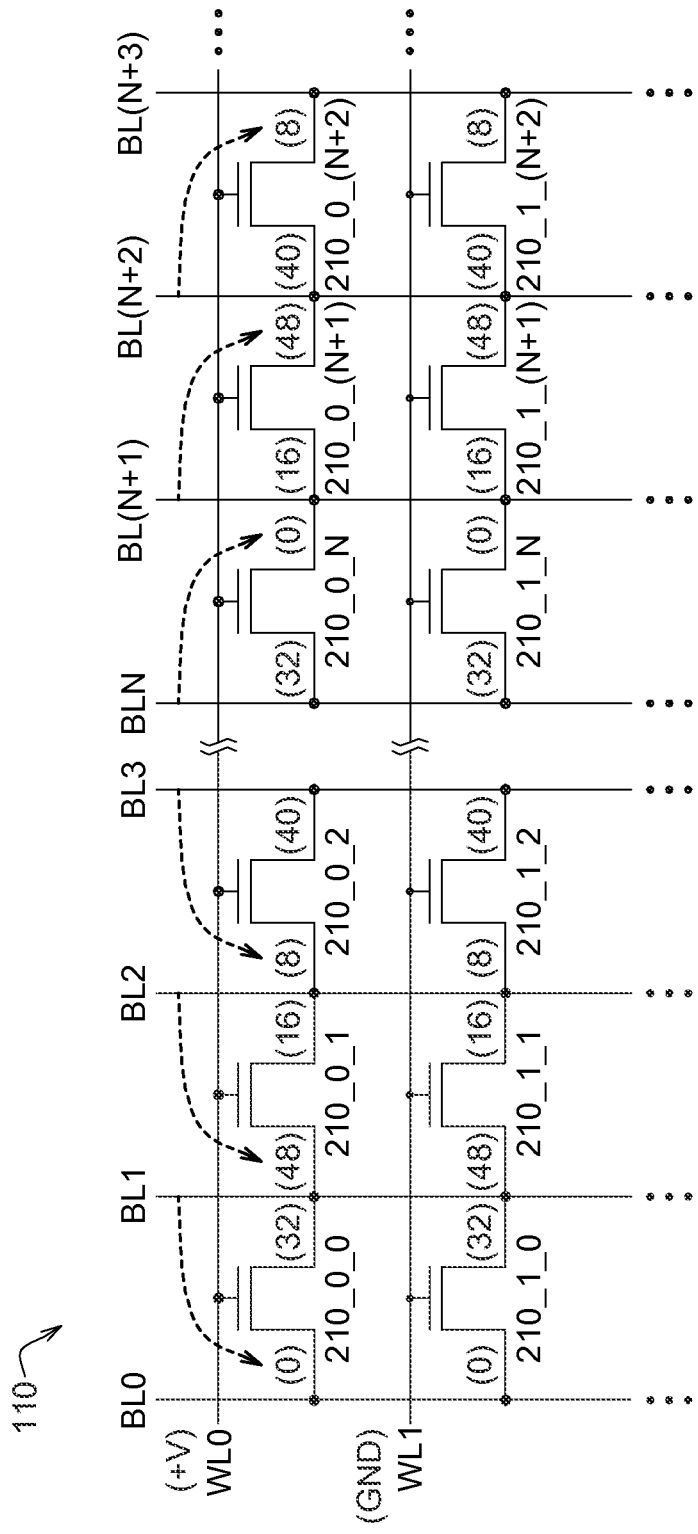
FIGS. 3A-3B show test according to an embodiment of the application.
Figure 3B:
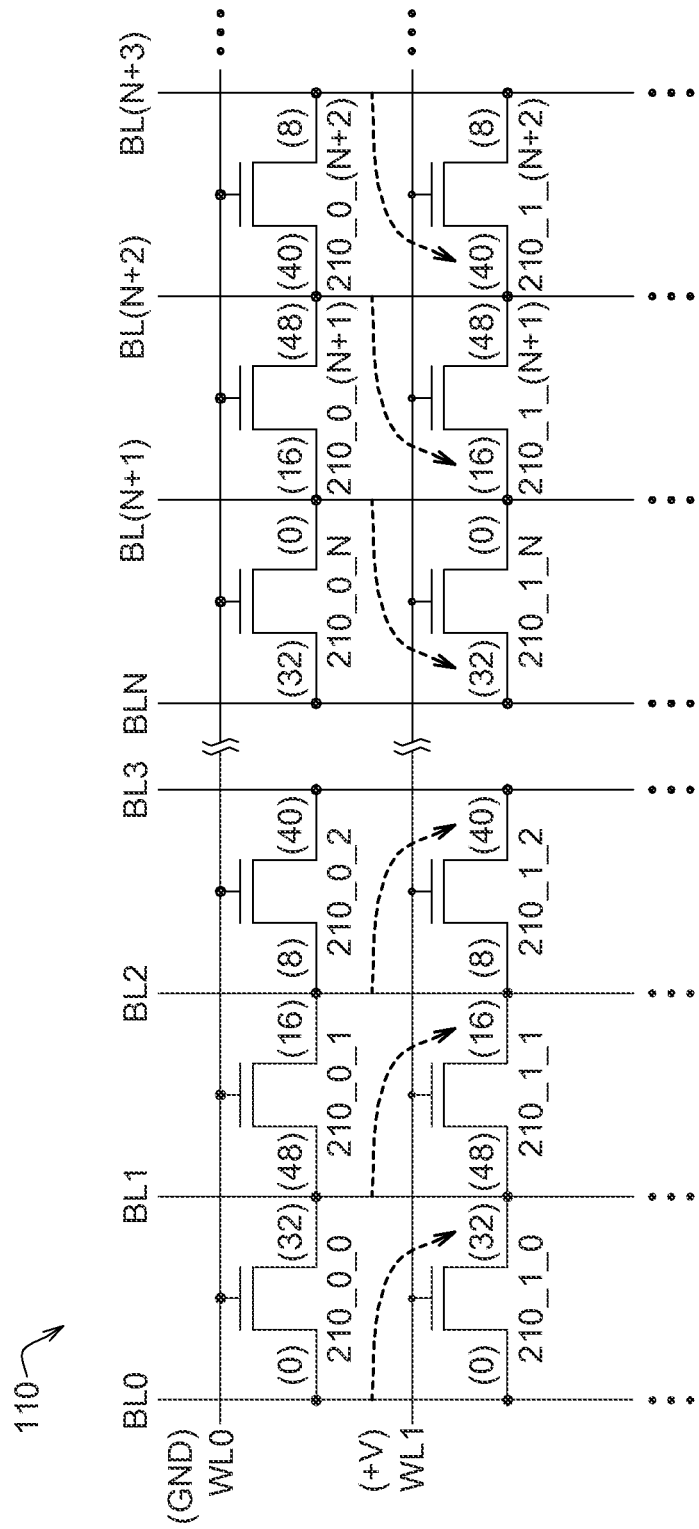

FIGS. 3A-3B show test according to an embodiment of the application. For simplicity, in testing, the word line which is applied by a test voltage is marked with "+V"; and on the contrary, the word line which is applied by a ground voltage is marked with "GND". Further, in testing the word line, the memory cells of the same page are concurrently read and tested.

As shown in FIG. 3A, in testing page 0 of the word line WL0, the bit lines BL1 and BLN are concurrently charged to test the left half bit of the memory cell 210_0_0 and the right half bit of the memory cell 210_0_N, respectively. In FIGS. 3A and 3B, the dotted arrow refers to that, the left/right half bit of the memory cell is tested by the charged bit line.

Similarly, in testing page 48 of the word line WL0, the bit lines BL2 and BL(N+1) are concurrently charged to test the left half bit of the memory cell 210_0_1 and the right half bit of the memory cell 210_0_(N+1), respectively. In testing page 8 of the word line WL0, the bit lines BL3 and BL(N+2) are concurrently charged to test the left half bit of the memory cell 210_0_2 and the right half bit of the memory cell 210_0_(N+2), respectively.

Further, in testing the word line, the bits of the same page on the same word line are concurrently test. After the whole page on the same word line is tested, the next page on the same word line is tested. For example, as shown in FIG. 3A, in testing the word line WL0, the test sequence may be page 0, page 2 (not shown) . . . and so on.

That is, as shown in FIG. 3A, the bit lines BL1, BLN, . . . and so on are concurrently charged to test bits of the page 0 of the word line WL0. In testing page 8 of the word line WL0, the bit lines BL3, BL(N+2), . . . and so on are concurrently charged to test bits of the page 8 of the word line WL0. In testing page 48 of the word line WL0, the bit lines BL2, BL(N+1), . . . and so on are concurrently charged to test bits of the page 48 of the word line WL0.

Similarly, in FIG. 3B, for testing the page 32 of the word line WL1, the bit lines BL0 and BL(N+1) are concurrently charged to test the right half bit of the memory cell 210_1_0
and the left half bit of the memory cell 210_1_N, respectively. For testing the page 16 of the word line WL1, the bit lines BL1 and BL(N+2) are concurrently charged to test the right half bit of the memory cell 210_1_1 and the left half bit of the memory cell 210_1_(N+1), respectively. For testing the page 40 of the word line WL1, the bit lines BL2 and BL(N+3) are concurrently charged to test the right half bit of the memory cell 210_1_2 and the left half bit of the memory cell 210_1_(N+2), respectively.

Further, in testing the same page on the same word line, the left half bits of 50% of the memory cells of the same page on the same word line are concurrently read and tested, and the right half bits of the other 50% of the memory cells of the same page on the same word line are concurrently read and tested.

In the embodiment of the application, in order to reduce the test time, in testing the same word line, each of the bit lines is charged/sensed once. Thus, in testing the same word line, not every page is read and tested. Of course, during the test of the whole memory array 110, all pages are read and tested. For example, in testing the word line WL0, the page 0 is read and tested, but the page 32 is neither read nor tested. Similarly, in testing the word line WL1, the page 32 is read and tested, but the page 0 is neither read nor tested.

Besides, in the embodiment, in testing the same word line, about 50% of the bit lines (or said, the first bit line group) are concurrently charged to read and test the left half bits of the memory cells on the left side of the first bit line group; and about the other 50% of the bit lines (or said, the second bit line group) are concurrently charged to read and test the right half bits of the memory cells on the right side of the second bit line group. In testing the next word line, the bit lines of the first bit line group are concurrently charged to read and test the right half bits of the memory cells on the right side of the first bit line group; and the bit lines of the second bit line group are concurrently charged to read and test the left half bits of the memory cells on the left side of the second bit line group. This is referred as "reverse read".

In the embodiment of the application, "half page read" is defined as that, if the bit on a single half of each memory cell is read and tested, then the bit on the other half of each memory cell is neither read nor tested.

In the application, "whole page read" is defined as that, the bits on both the left and the right halves of each memory cell are read and tested.

In prior test, the bits on both the left half and the right half of each memory cell are read and tested, and thus, in testing the same word line, each of the bit lines are charged twice. This results in a long test time in prior test. In the embodiment of the application, the bit on a single half of each memory cell is read and tested; and in testing the same word line, each bit line is charged once. Thus, the test time in the embodiment of the application may be reduced to 50%, compared with the prior test time.

In order to have an uniform test result, in the embodiment of the application, as for the same bit line, in testing the word line, the bit line may test bit of the left half of the memory cell on the left side of the bit line; but in testing the next word line, the bit line may test bit of the right half of the memory cell on the right side of the bit line. This test may have uniform test on a plurality of memory cells for assuring test quality and reliability.

Figure 4:
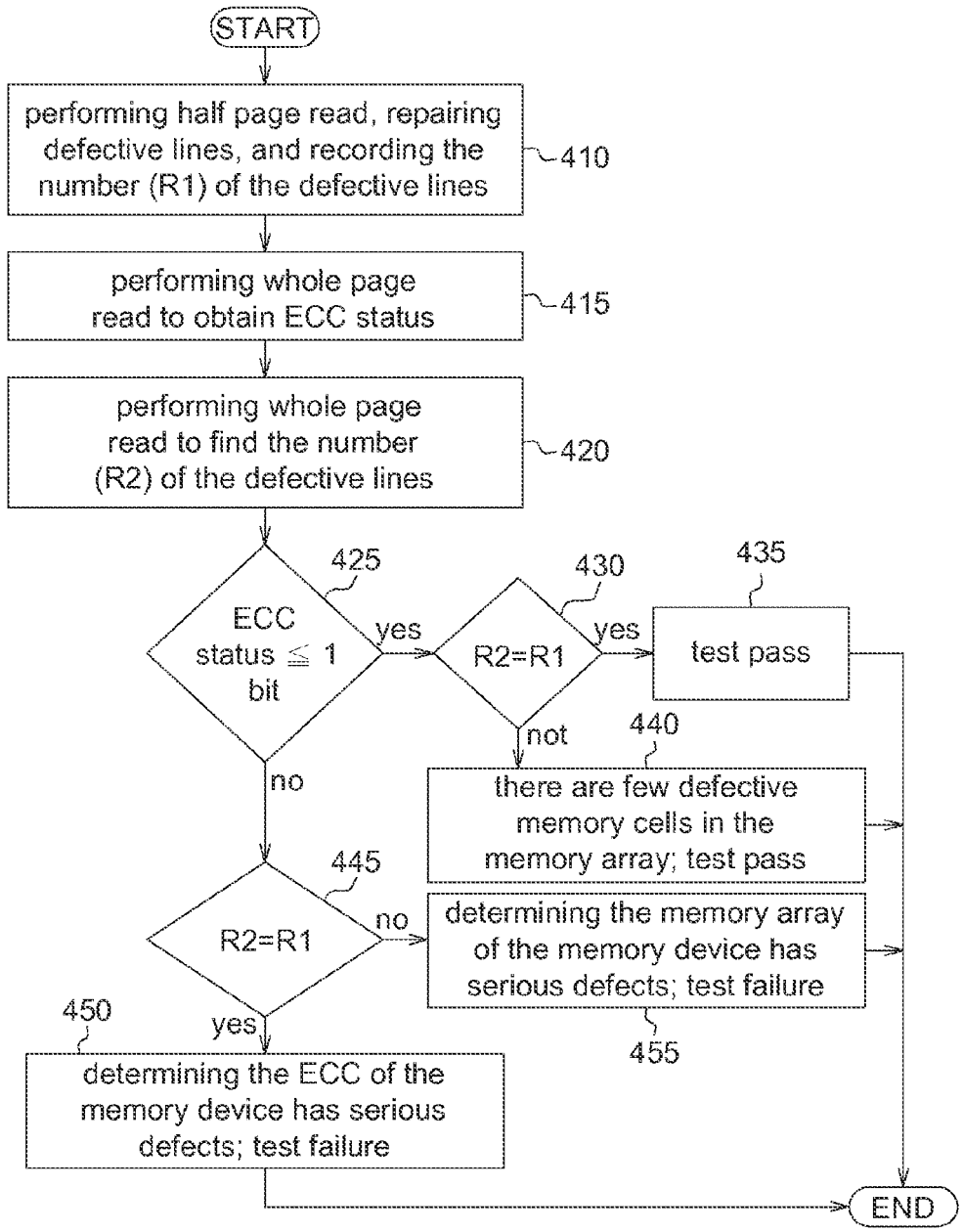
FIG. 4 shows a test flow according to another embodiment of the application, which is performed before mass product.

FIG. 4 shows a test flow according to another embodiment of the application, which is performed before mass product. In step 410, the half page read is performed on the memory array 110 to find all defective lines. For example, if the number of the defective memory cells on the word line WL0 reaches the first threshold, then the word line WL0 is checked as a defective line. Step 410 is for finding all defective lines on the word lines and on the bit lines. After the defective lines are found, the defective lines are repaired. For example, the first redundancy circuit 120 is used to repair/replace the defective word line (i.e. the whole defective word line is replaced by the redundancy word line of the first redundancy circuit 120); and the second redundancy circuit 130 is used to repair/replace the defective bit line (i.e. the whole defective bit line is replaced by the redundancy bit line of the second redundancy circuit 130). The number of the defective lines found in the step 410 is recorded as R1.

In step 415, the whole page read is performed on the repaired memory array to obtain ECC status. The ECC status refers to the ECC bit number which is used in repairing the memory array and the ECC array. The ECC status is output from the ECC 140. The ECC array is in the ECC 140 and the memory cells in the ECC array may be defective. That is, the ECC status may refer as the defective status of the memory array and the ECC array of the ECC 140.

As described above, if the number of the defective memory cells on the word line/bit line reaches the first/second threshold, then the word line/bit line is replaced by the first/second redundancy circuit 120/130. Alternatively, if the number of the defective memory cells on the word line/bit line is under the first/second threshold, then defective memory cells on the word line/bit line are repaired by the ECC 140.

In step 420, the whole page read is performed on the memory array 110 to find the number (R2) of the defective lines.

In step 425, whether the ECC status is smaller than or equal to 1 bit is determined. If the ECC status is smaller than or equal to 1 bit, then the defective memory cells in the memory array is few. Thus, the memory device may pass the test. Besides, in the embodiment, the memory device which passes the test is further analyzed.

In step 430, whether R2=R1 is determined. If R2=R1, then the number of the defective lines found by the half page read is equal to the number of the defective lines found by the whole page read. That is, the defective status of the memory cells of the memory array 110 is not serious and thus in the whole page read, no new defective line is found. Thus, the memory device is determined as "test pass" (step 435).

On the contrary, if R2 is not equal to R1 in the step 430, then it means that new defective line(s) is/are found in the whole page read. However, the memory device may be repaired by the ECC because there are few defective memory cells in the memory array. Thus, the memory device is determined as "test pass" (step 440).

If no in step 425, then it means that the defective status of the memory device is more serious (because the ECC status is higher than 2 bits). The memory device is determined as "test failure" in the embodiment of the application. Besides, in the embodiment, the memory device which is failed in the test is further analyzed.

In step 445, whether R2=R1 is determined. If R2=R1, it means that no new defective line is found in the whole page read. However, the embodiment determines that the ECC of the memory device has serious defects which result the ECC status higher than 2 bits. Thus, the memory device is determined as "test failure" (step 450).

If R2 is not equal to R1 in step 445, then it means the memory array of the memory device has serious defects which result finding of new line(s) in the whole page read. Thus, the memory device is determined as "test failure" (step 455).

Figure 5:
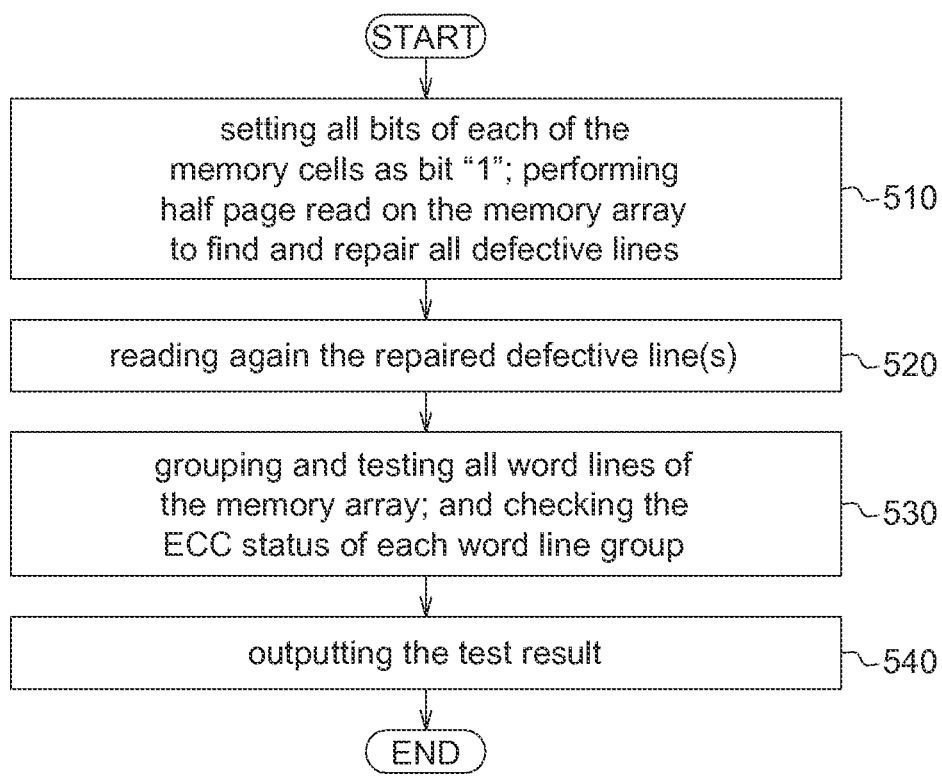
FIG. 5 shows a test flow according to still another embodiment of the application, which is performed after mass product.

FIG. 5 shows a test flow according to still another embodiment of the application, which is performed after mass product. In step 510, all bits of each of the memory cells are set as bit "1". The half page read is performed on the memory array to find and repair all defective lines of the memory array.

In step 520, the repaired defective line(s) is/are read again to determine whether the repair is successful.

In step 530, all word lines of the memory array are grouped and tested, and the ECC status of each word line group is checked. For example, 32 word lines are grouped as a word line group, and the whole page read is performed on each of the word line groups to check the ECC status of each word line group. If the whole page read of the current word line group indicates that the ECC status is smaller than or equal to 3 bits, then the whole page read is performed on the next word line group. On the contrary, if the whole page read of the current word line group indicates that the ECC status is higher than 3 bits, then the memory device is determined as "test failure". If any word line group is failed in the test, the memory device is determined as "test failure". The step 530 is repeated until all word line groups of the memory array pass the test, and thus the memory device is determined as "test pass".

In step 540, the test result is output.

Besides, in test, the above embodiments of the application may be combined. For example, in performing the test flow of FIG. 4 or FIG. 5, the half page read of FIG. 4 or FIG. 5 may be implemented by the half page read of FIG. 2.

Further, in testing, the test flow of FIG. 4 may be performed first, and then the test flow of FIG. 5 is performed on the memory device which is passed the test flow of FIG. 4.

As described above, the test flow of FIG. 4 or FIG. 5 applies the test method in FIGS. 3A and 3B, and thus the test time is shortened. Besides, the embodiment uses ECC to assure correctness of the test.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A test method for testing a memory device including a memory array, the memory array including a plurality of symmetric memory cells, a plurality of word lines and a plurality of bit lines, the test method including:
   in testing a first word line of the word lines,
   charging a first bit line of the bit lines to test a single bit of a first half of a first symmetric memory cell adjacent to the first bit line; and
   charging a second bit line of the bit lines to test a single bit of a second half of a second symmetric memory cell adjacent to the second bit line; and
   in testing a second word line of the word lines,
   charging the first bit line of the bit lines to test a single bit of the second half of a third symmetric memory cell adjacent to the first bit line; and
   charging the second bit line of the bit lines to test a single bit of the first half of a fourth symmetric memory cell adjacent to the second bit line;
   wherein in testing each of the word lines, each of the bit lines is charged once.

2. The test method according to claim 1, wherein in testing the first word line, either one of a first half and a second half of each of the symmetric memory cells on the first word line is read and verified.

3. The test method according to claim 2, wherein in testing the first word line,
the first halves of about 50% of the symmetric memory cells on the first word line are read and verified; and
the second halves of about the other 50% of the symmetric memory cells on the first word line are read and verified.

4. The test method according to claim 1, wherein in testing,
first halves of about 50% of the symmetric memory cells on the first bit line are read and verified; and
second halves of about the other 50% of the symmetric memory cells on the first bit line are read and verified.

5. The test method according to claim 1, wherein
all the symmetric memory cells are grouped into a plurality of pages; and
in verifying, bit lines coupled to one page of the pages are concurrently charged to read and verify the symmetric memory cells of the one page.

6. The test method according to claim 5, wherein
first halves of about 50% of the symmetric memory cells of the one page are concurrently read and verified; and
second halves of about the other 50% of the symmetric memory cells of the one page are concurrently read and verified.

* * * * *